United States Patent [19]

Kempster

[11] Patent Number: 4,760,356
[45] Date of Patent: Jul. 26, 1988

[54] POWER LINE FILTER

[75] Inventor: Robert W. Kempster, Ottawa, Canada

[73] Assignee: Leigh Instruments Limited, Ottawa, Canada

[21] Appl. No.: 852,325

[22] Filed: Apr. 15, 1986

[51] Int. Cl.$^4$ .......................... H03H 7/09; H03H 7/06
[52] U.S. Cl. ....................................... 333/177; 333/12; 333/17 L; 333/172; 333/181
[58] Field of Search ........ 333/167, 168, 172, 177–180, 333/181–185, 17 L, 12

[56] References Cited

U.S. PATENT DOCUMENTS

| | | | |
|---|---|---|---|
| 2,463,252 | 3/1949 | Doll | 333/178 X |
| 2,730,667 | 1/1956 | Uhlmann | 333/181 X |
| 2,733,414 | 1/1956 | Lansil | 333/177 |
| 3,705,365 | 12/1972 | Szabo et al. | 333/12 |
| 4,259,705 | 3/1981 | Stifter | 333/12 X |

OTHER PUBLICATIONS

Sekhri–"Power Line Filter", IBM Technical Disclosure Bulletin, vol. 17, No. 7, Dec. 1974; pp. 1998–1999.
Ficchi–"Electrical Interference", Hayden Book Company, Inc., New York, Scientific Library, Dec. 7, 1964; Title Page and pp. 45–58.

*Primary Examiner*—Marvin L. Nussbaum
*Attorney, Agent, or Firm*—Stanley E. Johnson

[57] ABSTRACT

A power line filter having at least an inductive element and a capacitive element and a circuit network with a coil therein coupled to the inductive element. The circuit network includes a capacitive element and resistive element parallel connected and in parallel with a serially connected inductive element and coil. The coil is closely coupled with the inductive element of the power line filter.

8 Claims, 1 Drawing Sheet

POWER LINE FILTER

FIELD OF INVENTION

This Invention relates to an improved power line EMI filter.

BACKGROUND OF INVENTION

Power line filters are commonly included in electronic equipment where protection is required against potentially damaging transient voltages on the power supply lines. In addition, such filters are frequently required to prevent the passage inward and outward of a wide range of signal frequencies, present at levels below the threshold of damage but sufficiently energetic to cause interference with proper function of the protected equipment, or other equipment sharing the same power line. Electrically, a filter consists of some number of capacitive and inductive elements arranged in a low-pass configuration, capable of passing the required supply current but providing attenuation of all unwanted frequencies and "spike" signals. A variety of power-line filters are available, and their use is widespread.

A serious shortcoming of the filters emerges when their conditions of application are examined. It is a commonplace of filter design that the required filter performance will not be met unless the design assumptions of source and termination impedance are closely approached in actual application. Values of 50-ohm source and termination impedance are often assumed in the design of line filters, and are stipulated by MIL-STD-220A for line filter testing. By contrast with this assumption, termination impedance is decided by the load which the filter feeds and may vary widely between near-short and near-open circuit values; source impedance is decided in the power line, and both in formal test and in the real world may be very low. The resulting filter performance may depart widely from design intent, and can in commonly-encountered conditions become worse than useless. Given low source and high termination impedance, the filter becomes a voltage amplifier which actually enhances high-voltage transients. Commercially available filters tested under these conditions have been found to have voltage gains as high as 60 times from input to output for certain signal frequencies.

SUMMARY OF INVENTION

An object of the present invention is to provide a filter capable of performing adequate suppression characteristics throughout despite variations in the combination of source and termination impedance values.

These and other objects are accomplished by the present invention wherein, to a basic filter circuit which has an inductive element and a capacitive element there is added a circuit which includes a coil, a capacitive and a resistive element and wherein such coil is closely coupled with the inductive element of the basic filter circuit.

LIST OF DRAWINGS

The invention is illustrated by way of example in the accompanying drawings wherein FIG. 1 is a schematic of the filter of applicants invention in its simplest form;

FIG. 2 is a schematic of a bi-direction filter provided in accordance with the present invention; and FIG. 3 is a schematic of a more refined bi-directional filter provided in accordance with the present invention.

DESCRIPTION OF PREFERRED EMBODIMENTS

Figure 1:
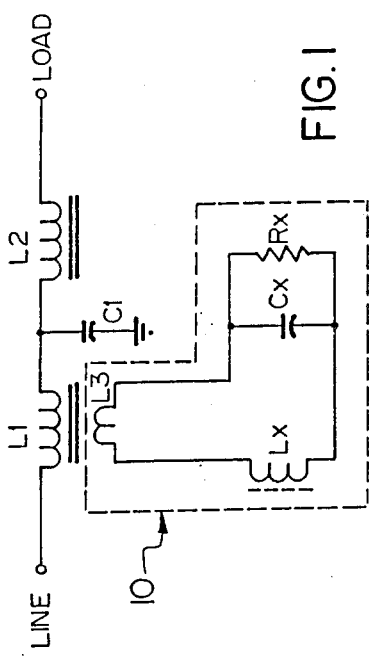

Referring to the drawings there is schematically illustrated in FIG. 1 a basic T-format filter circuit which includes inductances L1 and L2 in the power to load line such line being connect to ground through a condenser C1. In accordance with the present invention there is added thereto a network circuit generally indicated by the reference numbered 10.

The circuit 10 includes a resistance Rx in parallel with a capacitor Cx in parallel with serially connected inductance Lx and coil L3. Coil L3 is an auxillary winding on the core of inductance L1 and couples the network 10 to the main filter elements. The core of inductance L1 is a zero-gap, high permeability ferrite pot-core providing tight coupling between the coils of inductance L1 and auxilliary coil L3. Inductance Lx is a small auxillary pot core whose inductance value, added to the inductance of L3 is tuned by condenser Cx (a variable condenser) to the resonant frequency of the main inductances L1 and L2. Without damping this arrangement converts the single resonance peak of L1 and C1 into a double-peaked response of almost the same peak amplitude. Damping provided by resistance Rx lowers this high double peak into a broad flat response of low voltage gain.

The arrangement described provides useful performance over a range of combinations of coupling and damping values. Because of the very tight coupling between the main filter elements L1 and the damping network Lx, Cx, Rx, the standard formulae for calculating the behaviour of lightly-coupled tuned circuits do not yield accurate results in this application. Examination of a practical case illustrates this point: for a main filter mesh where L1=40mH and C1-0.1 $\mu$F, L3=4 $\mu$F, Lx=0.7 mH, Cx=2 $\mu$F, and for damping to optional flatness when source impedance is zero and output termination is open-circuit, Rx=15 $\Omega$. It will be noted that the main filter elements and the network elements have significantly different resonant frequencies; however, the strong mutual coupling "pulls" the two meshes together to display a flat, overcoupled response at about their geometric mean freque ncy. Note also that power and voltage levels in the network are low, so that components are physically small.

The T-format filter circuit of FIG. 1 without the network circuit 10, driven from a low impedance and terminated in an open-circuit, suffers from the same voltage-amplifying behaviour as the commonly used Pi and L filter formats. With the network circuit 10 added, the sharp resonant peak is broad-banded by overcoupling and damping to a width of more than an octave and the voltage gain has been found to be reduced from over 30 to about 1.1.

Figure 2:
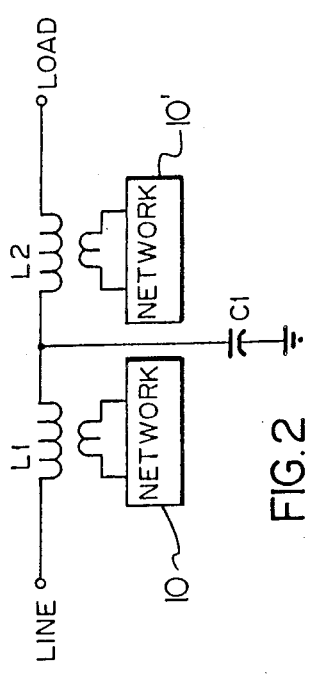

FIG. 2 is the same as FIG. 1 except for a duplicate network circuit designated 10' coupled to inductance L2 thereby providing a bi-directional filter.

Figure 3:
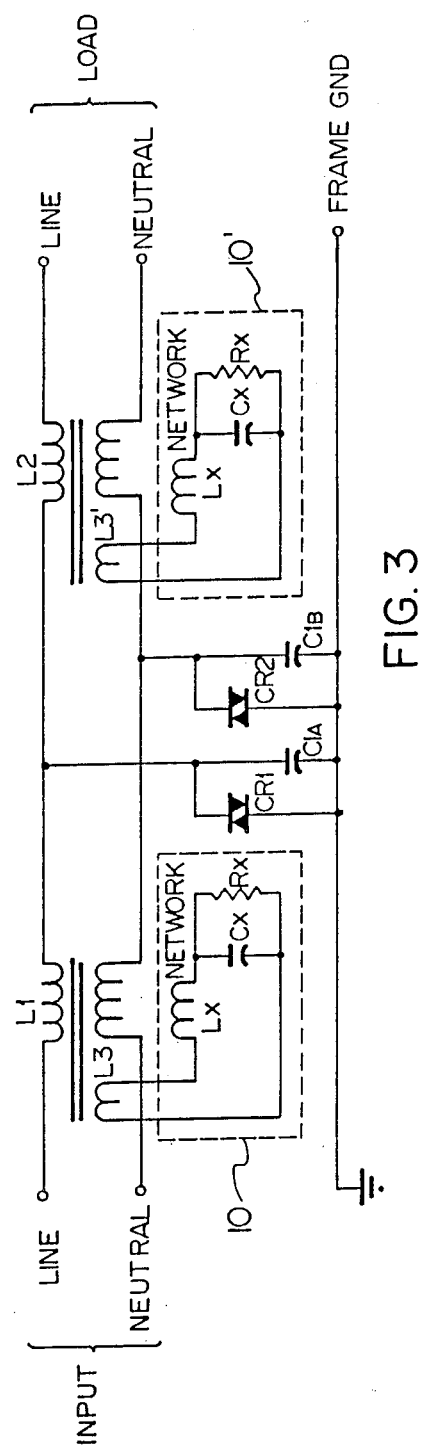

The above filter arrangement can be combined with other features to provide a practical filter with further advantages over the simple arrangement of FIGS. 1 and 2. FIG. 3 shows a bi-directional filter in which L1 and L2 are double-wound to carry both line and neutral load current, thereby cancelling the magnetizing effect of load current and permitting a zero-gapped core with minimum leakage inductance and maximum filtering performance.

In this embodiment the load and neutral lines are grounded through respective capacitors C1A and C1B by-passed by respective supressors CR1 and CR2. CR1 and CR2 are bi-directional overvoltage transient suppressors, added to provide protection against sustained high-voltage "spike" transients. The provision of the network circuit 10 on both L1 and L2 yields a bi-directional filter having high attenuation for unwanted signals into or out of the load. When calculating values for the circuit 10 in the dual-wound arrangement, C1 should be taken as the sum of capacitances of C1A and C1B as if in parallel.

The double-wound arrangement for L1 and L2 in FIG. 3 has, in addition to the magnetisation-cancelling feature, the advantage of cancelling most of the filter inductance effectively in series with the power line. This permits much higher inductance values for L1 and L2, with consequent improvement in filter characteristics; these values are in face set by the maximum dissipation that can be tolerated as a result of load current. Note that with a 400 Hz supply and a load current of 4 amperes, one millihenry of inductance in the power line would drop 10 volts of the supply and would create a regulation problem for the load. Using the double-winding principle the only inductance affecting the supply line is the sum of the leakage inductance values for L1 and L2; with zero-gap, high-permeability cores this total can be as low as 0.15% of L1 or L2. Depending on the nature of the load, even this residual inductance may be effectively removed; in one relevant application where the load is a transformerless high-voltage switching power supply, the obtrusively capacitive input to the unit can be "tuned out" by the residual inductance, thereby effectively removing the inductance and incidentally improving the power factor of the load from 0.6 to near 1.0.

A filter in accordance with the FIG. 3 embodiment has a number of beneficial characteristics for example:

(a) Pass-band characteristics which are not significantly changed by variations in source impedance down to zero ohms.

(b) Absence of significant voltage-multiplying behaviour under any combination of source and termination impedances, including the zero-impedance source, open-circuit termination combination.

(c) Improved low-pass and spike rejection characteristics as a consequence of the large L-values which can be tolerated, even in a power-line filter.

(d) Exceptional high-voltage transient protection, as a result of the low current-rise rate imposed by the high L values.

(e) Little variation is required rejection performance between single-and two-line transients; the very high coupling between the dual windings transforms all transients into substantially two-line events, for which the filter architecture is optimized.

(f) When used on DC power-line applications and in single-wire applications, the characteristic advantages of freedom from "ringing" and insensitivity to source and terminating impedances are retained.

(g) The dual winding principle for L1 and L2, with resulting cancellation of magnetising currents, greatly reduces the amount of energy stored in the filter inductors as a result of power-line current. As four separate inductors of 40 omH carrying an RMS load current of 4A, L1 and L2 would store 2.5 joules of energy which would be "dumped" in a very short time into line or load following a switch-off event, with possibility of damage and RFI generation. With the dual wound arrangement, this stored energy is reduced to 0.01 joule, including the contribution of C1A and B.

(h) The above performance features are obtained without sacrifice of the broad-band rejection capability of a convention filter; the NET feature interacts only in or near the resonance region of the primary filter and is inactive elsewhere. This results from the reactance of Lx rising with increasing frequency and masking the effect of the other NET components. Together with the impedance transformation produced by the ratio of L3 or L4 to the main filter inductance, the shunting effect of the rejected impedance of the NET features across L1 and L2 becomes negligible at frequencies appreciably above the filter cut-off.

The embodiments of the invention in which an exclusive property or privilege is claimed are defined as follows:

1. In a power line filter which includes a first discrete lumped parameter capacitive element having a predetermined value of capacitance and connected between the power line and a source of ground potential and a first inductive element in series with the power line, the improvement comprising:
   a coil, having two terminals and inductively closely coupled to said first inductive element; and
   a damping network connected across said two coil terminals, including, in series, a second inductive element and a parallel circuit having a second capacitive element in one branch and a resistive element in another branch.

2. In a power line filter which includes a first capacitive element connected between the power line and a source of ground potential and a first inductive element in series with the power line, the improvement comprising:
   a coil, having two terminals and inductively closely coupled to said first inductive element;
   a damping network connected across said two coil terminals, including, in series, a second inductive element and a parallel circuit having a second capacitive element in one branch and a resistive element in another branch; and
   a third inductive element in series with said first inductive element and wherein a point of connection of said first capacitive element to the power line is made at a junction of said serially connected first and third inductive elements.

3. A power line filter as described in claim 2 wherein the resonant frequency of said damping network is made equal to the series resonance of said first inductive element in combination with said first capacitive element.

4. A bidirectional power filter comprising, in series, a line input terminal, a first inductive element, a second inductive element, and an output load terminal;
   a first capacitive element having a first terminal connected to a ground potential and a second terminal connected to a junction of said first and second inductive elements;
   first and second coils, each having two terminals, said coils inductively closely coupled to said first and second inductive elements, respectively; and first and second damping circuits connected across said two terminals of said first and second coils, respectively, each of said damping circuits further comprising, in series, a third inductive element and a parallel circuit having a second capacitive element in one branch and a resistive element in another branch.

5. A filter as described in claim 4 further comprising, in series, a neutral input terminal, a fourth inductive element, a fifth inductive element, and a neutral output load terminal; and a third capacitive element having a first terminal connected to a source of ground potential and a second terminal connected to a junction of said fourth and fifth inductive elements, wherein said first and fourth inductive elements comprise mutual bifilar windings and said second and fifth inductive elements comprise mutual bifilar windings.

6. A filter as described in claim 5 further comprising first and second transient suppressor elements bypassing said first and third capacitive elements, respectively.

7. A power line filter which includes a first lumped parameter capacitive element connected between the power line and a source of ground potential and a first inductive element in series with the power line, the improvement comprising:

a coil, having two terminals and inductively closely coupled to said first inductive element; and a damping network connected across said two coil terminals, including, in series, a second inductive element and a parallel circuit having a second capacitive element in one branch and a resistive element in another branch wherein a resonant frequency of said damping network is made equal to a series resonance of said first inductive element in combination with said first capacitive element.

8. In a power line filter which includes a first capacitive element connected between the power line and a source of ground potential and a first inductive element in series with the power line, the improvement comprising:

a coil having two terminals and inductively closely coupled to said first inductive element;

a damping network connected across said two coil terminals, including, in series, a second inductive element and a parallel circuit having a second capacitive element in one branch and a resistive element in another branch;

said coil being overcoupled with said first inductive element such that said coil together with said damping network produces a heavily overcoupled and critically damped dual tuned circuit wherein no high resonant peak of voltage is developed when the power line filter is excited by a signal having a frequency equal to the resonant frequency of the power line filter.

* * * * *